United States Patent [19]
Hewitt et al.

[11] Patent Number: 5,546,039
[45] Date of Patent: Aug. 13, 1996

[54] CHARGE DISSIPATION IN CAPACITIVELY LOADED PORTS

[75] Inventors: Larry D. Hewitt; Ryan Feemster, both of Austin, Tex.

[73] Assignee: Advanced Micro Devices, Inc., Sunnyvale, Calif.

[21] Appl. No.: 423,059

[22] Filed: Apr. 17, 1995

Related U.S. Application Data

[63] Continuation-in-part of Ser. No. 333,451, Nov. 2, 1994.

[51] Int. Cl.$^6$ .......................... H03K 17/16; H03K 5/12
[52] U.S. Cl. .......................... 327/379; 327/380; 327/170; 327/111; 326/21
[58] Field of Search .......................... 327/392–396, 327/399–401, 108–112, 379–391, 134, 170, 306, 309, 310, 313, 312, 551, 374–377; 326/21–25, 17, 82, 83, 87; 377/73–76, 56

[56] References Cited

U.S. PATENT DOCUMENTS

| | | | |
|---|---|---|---|
| 3,714,508 | 1/1973 | Harnden, Jr. et al. | 327/401 |
| 3,816,724 | 6/1974 | Wentworth | 327/396 |
| 4,903,242 | 2/1990 | Hamaguchi et al. | 377/73 |
| 4,918,339 | 4/1990 | Shigeo et al. | 307/542 |
| 4,992,676 | 2/1991 | Gerosa et al. | 326/27 |
| 5,124,579 | 6/1992 | Naghshineh | 307/443 |
| 5,218,239 | 6/1993 | Boomer | 307/443 |
| 5,306,965 | 4/1994 | Asprey | 326/83 |
| 5,495,199 | 2/1996 | Hirano | 327/379 |

*Primary Examiner*—Toan Tran
*Attorney, Agent, or Firm*—Fulbright & Jaworski L.L.P.

[57] ABSTRACT

A cascade of triggering circuits sequentially activates a series of parallel pull-down paths in reflexive response to a pull-down signal indicating correspondence between the potential on a capacitively loaded port and a selectable threshold voltage. The triggering circuits are clocked with a common signal to sequentially propagate the pull-down signal from prior to subsequent triggering stages to sequentially activate corresponding parallel paths. In a preferred embodiment, the D flip-flops of a sequential cascade control multiple pull-down paths to regulate charging and discharging of a joystick capacitive load on a monolithic audio personal computer IC game port. To initiate charging of the joystick capacitor, the flip-flops simultaneously disable the pull-down paths in response to a system WRITE signal. To discharge the joystick capacitor, the flip-flops sequentially propagate a comparator derived pull-down signal to sequentially enable the pull-down paths to controllably dissipate the accumulated charge.

28 Claims, 4 Drawing Sheets

CHARGE DISSIPATION IN CAPACITIVELY LOADED PORTS

RELATED APPLICATIONS

This application is a continuation-in-part of U.S. patent application Ser. No. 08/333,451 filed Nov. 2, 1994, which is hereby incorporated in its entirety by reference.

TECHNICAL FIELD

The present invention relates to electrical charge dissipation control in integrated circuits and, in particular, to reduction of peak currents on capacitively loaded CMOS ports.

BACKGROUND OF THE INVENTION

When a capacitively loaded CMOS port transitions to ground potential, large amounts of charge are rapidly injected into the local ground plane ("Vss") of the integrated circuit ("IC"). Because charge is injected faster than it can be dissipated, Vss experiences a momentary jump in voltage. This is known as "ground bounce."

Ground bounce may cause errors within the IC and can degrade the certainty of IC logic. For example, internal flip-flops sometimes rely upon Vss as a reference voltage. If Vss bounces while it is used as a voltage reference, signals evaluated with reference to Vss may be mistakenly categorized.

The instantaneous relationship between current ("i"), voltage ("v"), and capacitance ("C") can be expressed as:

$$i = C \, dv/dt,$$

while the associated expression relating voltage and inductance ("L") is given by:

$$v = L \, di/dt.$$

These expressions show that increasing the discharge time, the "dt" term, will reduce the peak current and the peak voltage and reduce, therefore, the ground bounce.

A variety of methods have been offered to decrease ground bounce. Some techniques reduce the current drive capacity of a single pull-down transistor by decreasing its channel width. Such methods however, often degrade the high-speed performance of the circuit.

Other methods suggest the use of parallel pull-down transistors, but many utilize complicated control circuitry to match charge dissipation rates to the magnitude of the impulse or particular desired waveform shapes. For example, in U.S. Pat. No. 5,218,239 to Boomer, a variety of control inputs are purportedly used to switch transistors to provide a digitally selectable choice of transition times.

Other systems vary the voltage to the gates of the pull-down transistors to slowly turn on multiple charge dissipation routes. Examples of such methods are purportedly taught in U.S. Pat. No. 5,124,579 to Naghshineh.

The prior art has generally focused on the field of high speed circuitry where ground bounce is implicated by parasitic capacitive and inductive characteristics. In the area of game port peripheral switching, however, ground bounce is caused when large capacitive loads are intentionally used to map joystick coordinates. Unlike DRAM design where parasitic capacitances of hundreds of pico-farads must be regulated, joystick loads present many thousands of intentionally stored pico-farads of charge. Consequently, many of the offered ground bounce solutions are not adapted for game port peak current control. What is needed therefore, is an inexpensive and simple circuit to reduce peak transition currents on capacitively loaded game ports.

SUMMARY OF THE INVENTION

An object of the present invention is, therefore, to provide a method and apparatus for reducing peak transition currents during IC port switching of capacitive loads.

Another object of this invention is to provide such a method and apparatus adaptable to automatic operation on specific ports.

A further object of the present invention is to provide such a method and apparatus adapted to personal computer game port peripheral charging and discharging control.

The present invention uses a cascade of triggering circuits to sequentially activate a series of parallel pull-down paths in reflexive response to a pull-down signal indicating correspondence between the potential on a capacitively loaded port and a selectable threshold voltage. The triggering circuits are clocked with a common signal to sequentially propagate the pull-down signal from prior to subsequent triggering stages to sequentially activate corresponding parallel paths. Because the rate of charge dispersion depends upon fixable values such as the number of pull-down paths, individual path resistance, and the common clock frequency, anticipated capacitive loads may be accurately and predictably regulated without computational overhead.

In a preferred embodiment, D flip-flops arranged in a sequential cascade control multiple pull-down paths to regulate charging and discharging of a joystick capacitive load on a monolithic audio personal computer IC game port. To initiate charging of the joystick capacitor, the flip-flops simultaneously disable the pull-down paths in response to a system WRITE signal. To discharge the joystick capacitor, the flip-flops propagate a comparator-derived pull-down signal to sequentially enable the pull-down paths to controllably dissipate the accumulated charge.

DETAILED DESCRIPTION OF A PREFERRED EMBODIMENT

Figure 1:
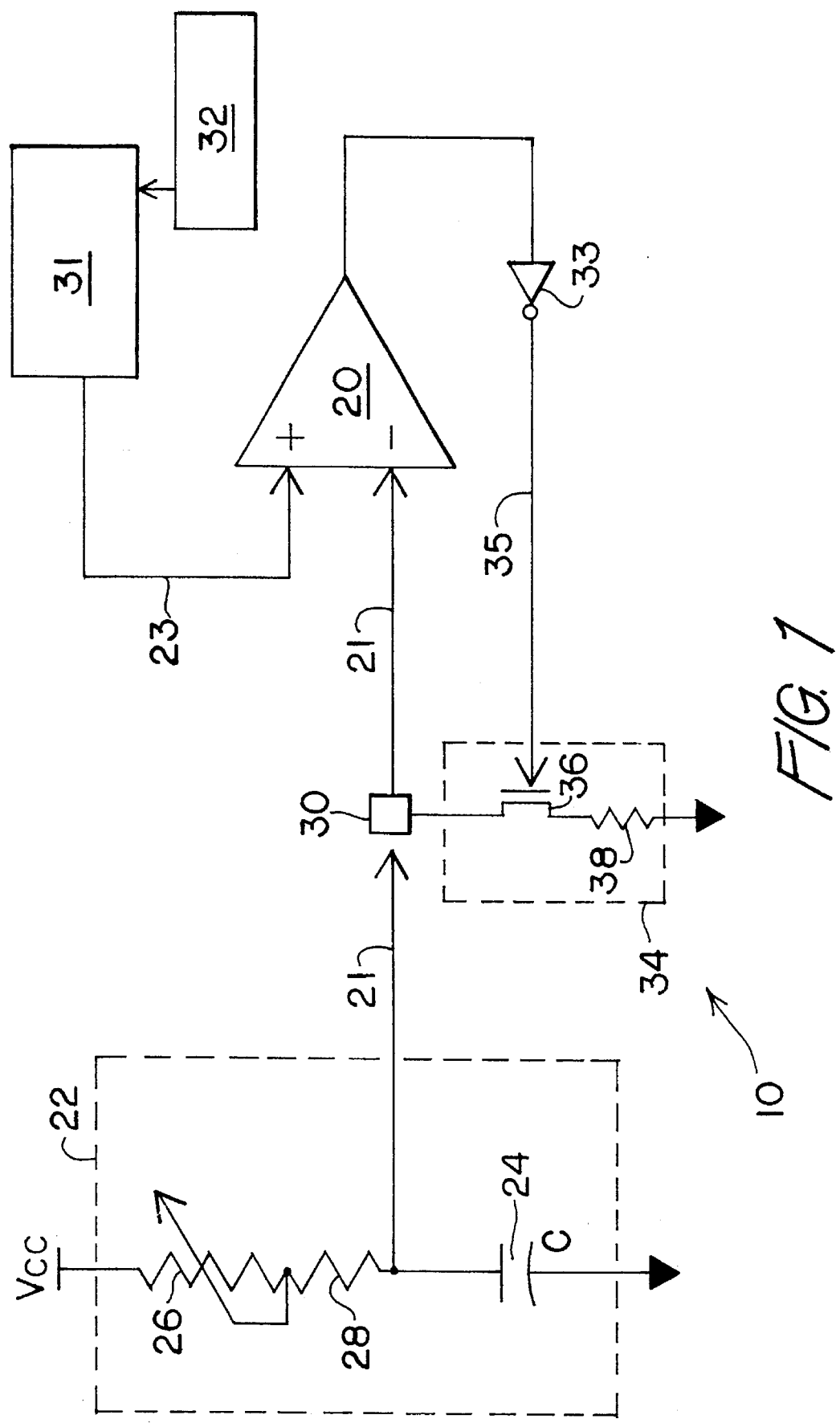
FIG. 1 is a block diagram of an IC game port without specific provision for load charge dissipation.

FIG. 1 shows an IC game port system 10 nominally designed without specific provision for regulating load charge dissipation. System 10 is built into a personal computer monolithic integrated audio circuit, having an analog-to-digital and digital-to-analog signal conversion module and a digital audio signal synthesizer module.

The comparator signal from system 10 is used to evaluate elapsed charging times of a joystick capacitor 24, and therefore, joystick controller 22 coordinates. System 10 compares the load signal 21 from the joystick 22 with a digitally selected threshold signal 23 to determine whether the load signal 21, and consequently, the capacitor 24 has reached the threshold level.

As depicted in FIG. 1, the load signal 21 provided to comparator 20 from joystick 22 expresses the voltage of joystick capacitor 24. Capacitor 24 is charged from Vcc through potentiometer 26 and resistor 28. Potentiometer 26 is a variable resistance element controlled by a movable joystick control handle. The joystick control handle varies the amount of current flowing through potentiometer 26 and thereby the charging rate of capacitor 24. The time required to charge capacitor 24 to a selected threshold voltage indicates the coordinate position of the joystick control handle.

The load signal 21 from joystick 22 enters the monolithic integrated circuit through pad 30 and is directed to the inverting input of comparator 20. Comparator 20 compares the load signal 21 potential with a threshold signal 23 controllably provided comparator 20 by digital-to-analog ("DAC") converter 31 controlled by microprocessor 32.

The output of comparator 20 is inverted by inverter 33 to produce a pull-down signal provided to pull-down path 34. When the potential of the load signal 21 surpasses the threshold signal 23 potential, the output of comparator 20 goes LOW. Inverter 33 inverts the LOW output of comparator 20 to produce a HIGH pull-down signal 35 that activates transistor 36 in pull-down path 34. When transistor 36 becomes active, current from capacitor 24 flows through the load signal line 21 into transistor 36 and to Vss through resistor 38.

Those skilled in the art will recognize that other than the value of resistor 38 and the dimensions of transistor 36, there are no provisions in the schematic design of system 10 to limit the rate of current discharge through pull-down path 34. Consequently, as the charge from capacitor 24 is dissipated through pull-down path 34, the IC ground plane may experience an instantaneous, and deleterious, jump in voltage.

Figure 2:
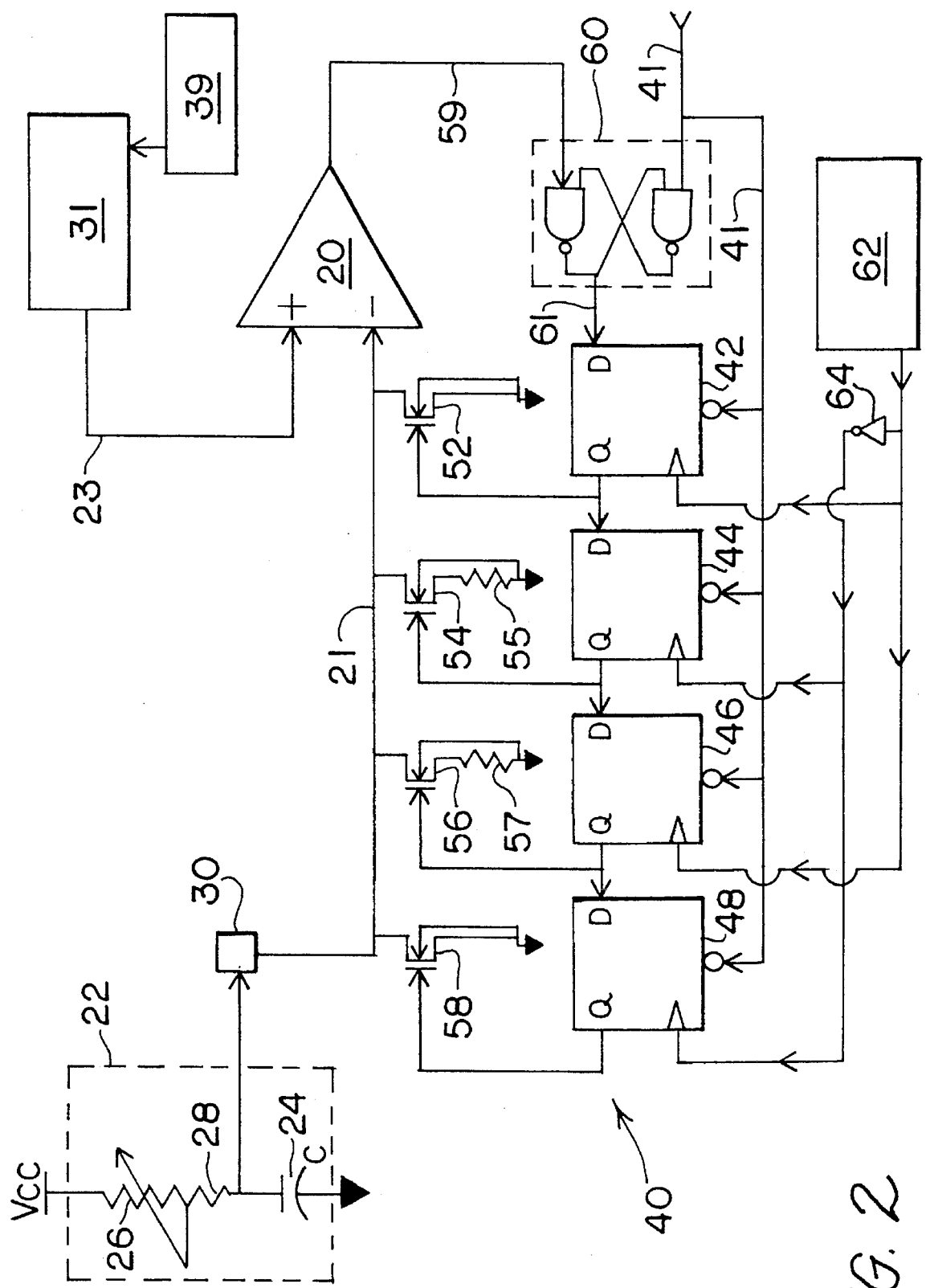
FIG. 2 is a block diagram of a load charge dissipation system arranged and controlled in accordance with the present invention.

FIG. 2 is a diagram of system 40 depicting a preferred embodiment of the present invention. Network 40 employs flip-flops 42, 44, 46, and 48 to controllably and predictably discharge capacitor 24.

With reference to FIG. 2, the load signal 21 provided to comparator 20 expresses the voltage of joystick capacitor 24. As in the system of FIG. 1, the load signal 21 enters the monolithic integrated circuit through pad 30 and is directed to the inverting input of comparator 20.

Four conduction paths through pull-down transistors 52, 54, 56, and 58 are available to divert the charge on capacitor 24 from the load signal 21 line to a "dirty" IC metal ground. As depicted in FIG. 2, the gate of each pull-down transistor is controlled by the Q output of a corresponding flip-flop. When the system WRITE signal 41 is asserted LOW, the Q outputs of flip-flops 42, 44, 46, and 48 are fixed LOW causing transistors 52, 54, 56, and 58 to present a high impedance to the load signal line 21. Asserting WRITE 41 overrides all flip-flop inputs and fixes all Q outputs LOW to initiate charging of capacitor 24.

When the charge on capacitor 24 reaches a potential surpassing the threshold signal 23 from DAC 31, the comparator output signal goes LOW. In a preferred embodiment, DAC 31 obtains the digital representation of the microprocessor selected threshold signal 23 value from joystick trim register 39 on-board the monolithic IC. DAC 31 may alternatively receive digital data from a register located off the IC either internal or external to the controlling microprocessor. When the comparator output signal goes LOW, system WRITE 41 is released, freeing the flip-flop cascade for normal flip-flop propagation of D input states to Q outputs in response to state changes of clock 62.

When the comparator output signal goes LOW, the FLIP-FLOP pull-down signal 61 from dual-NAND gate flip-flop 60 goes HIGH. The HIGH pull-down signal propagates from the D input to the Q output of flip-flop 42 when clock 62 changes from LOW to HIGH. As the Q output of flip-flop 42 goes HIGH, transistor 52 activates and current begins to flow from capacitor 24 through transistor 52 to the ground plane. The rate of current flow through transistor 52 is controlled by appropriately sizing transistor 52. Those skilled in the art will recognize, however, that transistor 52 may be linked to Vss through a resistor for more limited initial current flow to ground in response to the state change of flip-flop 42.

Inverter 64 inverts the clock 62 waveform to present a LOW to HIGH clock transition at the clock inputs of flip-flops 44 and 48 in opposition to the state change of clock 62. In the preferred embodiment of FIG. 2, this allows the flip-flop cascade to propagate the FLIP-FLOP pull-down signal 61 in the appropriate amount of time.

As the clock input to flip-flop 44 changes from LOW to HIGH, the HIGH FLIP-FLOP pull-down signal 61 on the Q output of flip-flop 42 propagates through flip-flop 44 to appear at the Q output of flip-flop 44 and activate transistor 54. In response, now active transistors 52 and 54 conduct current from capacitor 24 to the ground plane. Transistor 54 is linked to Vss through an $N^+$ implant resistor 55 having a nominal value of approximately 300 ohms.

The next state change of clock 62 propagates the HIGH pull-down signal at the Q output of flip-flop 44 from the D input to the Q output of flip-flop 46 activating transistor 56. In response, current from discharging capacitor 24 now flows through transistors 52, 54, and 56 to ground. Transistor 56 is linked to Vss through $N^+$ implant resistor 57 having a nominal impedance of approximately 150 ohms.

The values of resistors 55 and 57 may be derived to limit the peak current flow while dissipating the charge on capacitor 24 in the desired amount of time. Other resistors may also be placed between transistors 52 and 58 and the charge absorbing ground plane. Consequently, the sizes of resistors 55 and 57 and other optional resistors associated with transistors 52 and 58 will depend upon the size of capacitor 24, the dimensions of transistors 52, 54, 56, and 58, the desired discharge time, and the maximum allowable peak current.

As clock 62 next changes state, the HIGH pull-down signal appearing at the Q output of flip-flop 46 propagates through flip-flop 48 to appear at the Q output of flip-flop 48 and activate transistor 58. Current from discharging capacitor 24 flows through all four conduction paths as the remaining charge in capacitor 24 controllably dissipates into the ground plane.

In the preferred embodiment of FIG. 2, clock 62 oscillates at 1 mega-Hertz and capacitor 24 is discharged in approximately 2 microseconds. Other discharging times may be selected by varying the number of pull-down conduction paths and transistors, the resistance in each conduction path to ground and the clock speed.

Figure 3A:
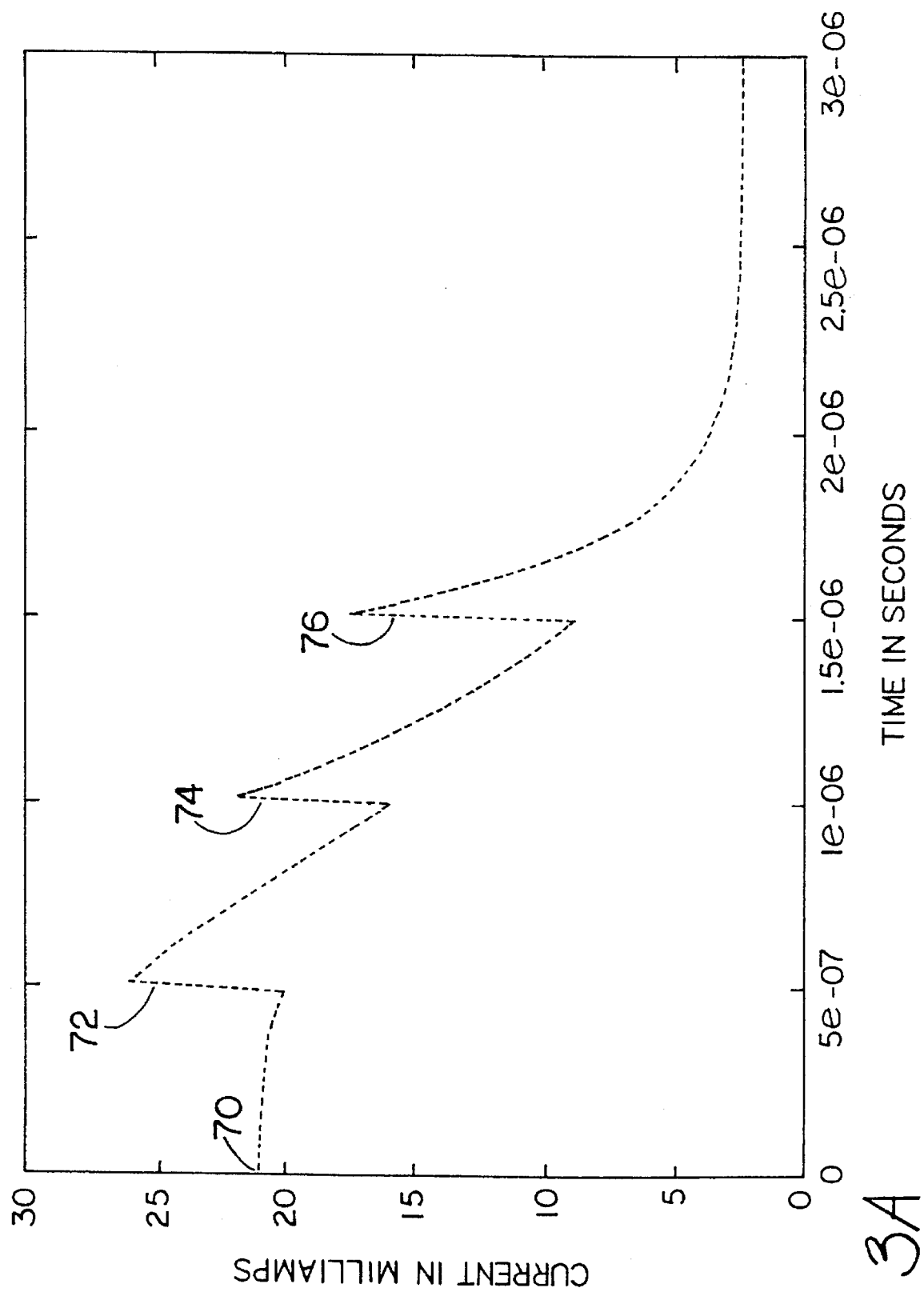
FIG. 3A is a graph of a typical current waveform generated during the dissipation of a joystick capacitive load charge by the system of FIG. 2.
Figure 3B:
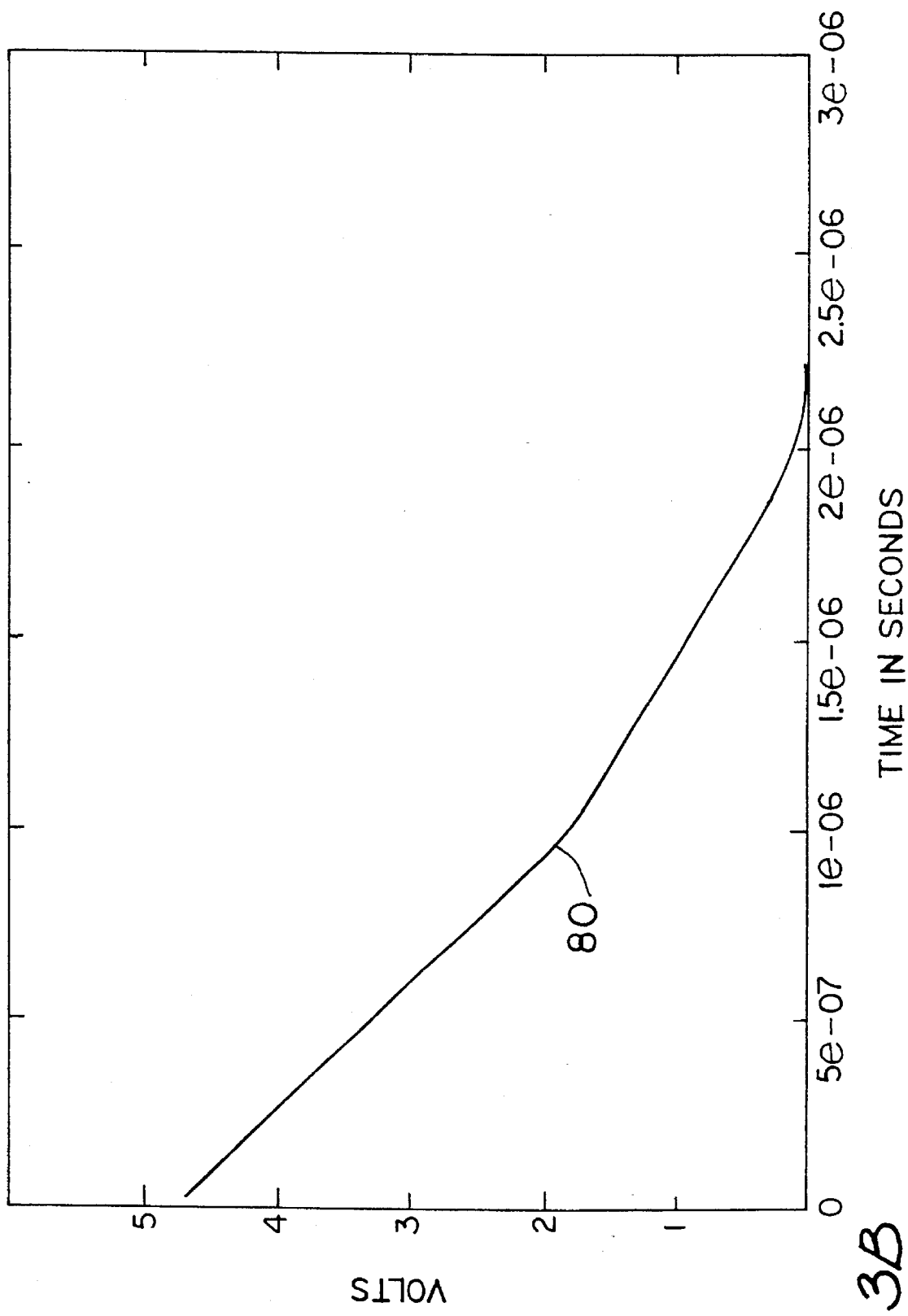
FIG. 3B is a graph of a typical voltage waveform generated during the discharging of a joystick capacitive load by the system of FIG. 2.

FIG. 3A depicts the waveform of the current flowing through pad 30 when the system of FIG. 2 is used to discharge capacitor 24. In FIGS. 3A and 3B, clock 62 is cycling at 1 mega-Hertz and capacitor 24 is a 6500 picofarad capacitor charged from a Vcc of 5 volts through a resistance of 2K ohms.

With reference to FIG. 3A, reference character 70 identifies the activation of transistor 52. Character 72 identifies the activation of transistor 54, while character 74 marks the activation of transistor 56 and character 76 notes the activation of transistor 58. The resulting slope of the current waveform can be varied to fit system timing needs by changing the number of pull-down paths, the size of the pull-down transistors and resistors and the clock speed.

FIG. 3B depicts the waveform of the voltage on pad 30 loaded with a 6500 pF capacitor 24 to Vss and a 2K ohm resistor to Vcc. As FIG. 3B shows, waveform 80 declines with substantial linearity from approximately 5 volts to zero volts in about 2 microseconds as charge from capacitor 24 is dissipated to the IC ground.

It will be obvious to those having skill in the art that many changes may be made in the above-described details of a preferred embodiment of the present invention without departing from the underlying principles thereof. The scope of the present invention should, therefore, be determined only by the following claims.

We claim:

1. A method for regulating dissipation of electrical charge from capacitive loads on a port in a monolithic integrated circuit, said method comprising the steps of:

providing a chargeable capacitive load;

providing a load signal indicating the potential of said capacitive load;

linking said load signal to the integrated circuit ground through plural parallel gated transistors;

providing plural clock responsive triggering networks arranged in a sequential cascade, each selected one of said triggering networks having an output signal for controlling a corresponding selected one of said plural parallel gated transistors and an input signal clockable to appear as said output signal;

generating a digitally selected threshold signal;

comparing said load signal and said threshold signal to derive a pull-down signal;

supplying said pull-down signal as input signal of a leading triggering network of said sequential cascade;

clocking said plural triggering networks with a clocking signal to sequentially propagate the state of said pull-down signal forward through said leading triggering network and each subsequent one of said plural triggering networks to sequentially enable said plural paths in substantial timed correspondence with sequential state changes of said clocking signal.

2. The method of claim 1 wherein said plural triggering networks have an output-signal-determining input signal and further comprising the steps of:

supplying a system signal; and disabling said plural parallel gated transistors in substantial coincidence by supplying said system signal as said output signal determining input signal of each selected one of said plural triggering networks.

3. The method of claim 1 wherein said sequential cascade is characterized by the arrangement of first and second ones of said plural triggering networks wherein said output signal of said first network provides said input signal of said second network and said input signal of said first network is clocked through said first network to appear as said output signal of said first network on a first state change of said clocking signal and said input signal of said second network is clocked through said second network to appear as said output signal of said second network on a second state change of said clocking signal.

4. The method of claim 1 wherein said sequential cascade is characterized by the linear arrangement of a first one and a second one of said plural triggering networks wherein the output signal of said first one of said plural triggering networks provides a signal state for the input signal of said second one of said plural triggering networks.

5. The method of claim 4 wherein said cascade responds to said clocking signal by propagating a determined state of said input signal of said first network to appear as the state of said output signal of said first network in correspondence with a state change of said clocking signal.

6. The method of claim 5 wherein said cascade responds to a further state change of said clocking signal by propagating said determined state of said output signal of said first network to appear as the state of said output signal of said second network.

7. The method of claim 2 wherein said capacitive load is charged through a variable resistance element in response to said disabling of said plural parallel gated transistors.

8. The method of claim 2 wherein one or more of said gated transistors comprise a dissipation transistor in series with a resistive element.

9. The method of claim 2 wherein said plural triggering networks are D flip-flops.

10. A method for reducing peak transition currents on a capacitively loaded port in a monolithic integrated circuit having an analog-to-digital and digital-to-analog signal conversion module and a digital audio signal synthesizer module, said method comprising the steps of:

providing a capacitively derived load signal;

linking said load signal to the integrated circuit ground through plural parallel paths, each path having a gated transistor and a resistor;

providing plural triggering networks arranged in a sequential cascade;

generating a digitally selected threshold signal;

comparing said load signal and said threshold signal to derive a pull-down signal;

supplying said pull-down signal as an input signal to said cascade;

clocking said plural triggering networks with a common clocking signal; and sequentially enabling said plural parallel paths by supplying selected ones of said gated transistors with an output signal from selected corresponding ones of said plural triggering networks, said output signals derived sequentially as the state of said cascade input signal sequentially propagates through said cascade in substantial timed correspondence with said clocking signal.

11. The method of claim 10 wherein each of said plural triggering networks has an output-determinative input signal and further comprising the step of:

supplying a system signal; and disabling said plural parallel paths in substantial coincidence by supplying said system signal as the output-determinative input signal of each of said plural triggering networks.

12. The method of claim 11 wherein said resistors of said plural parallel paths are scaled in value to limit maximum current during port transition to ground state from a value corresponding to said threshold signal.

13. The method of claim 11 wherein said load signal is generated by a system comprising a capacitor charged through a potentiometer.

14. The method of claim 13 wherein said system is a game joystick.

15. A method for regulating peak transition currents on a capacitively loaded port, said method comprising the steps of:

providing a monolithic integrated circuit;

providing said monolithic integrated circuit with a capacitively derived load signal;

linking said load signal to the integrated circuit ground through plural parallel paths, each path having a switchable transistor;

providing plural triggering networks arranged in a sequential cascade, said sequential cascade having an input signal;

supplying a pull-down signal as said cascade input signal;

propagating said pull-down signal through said cascade by sequentially activating said plural triggering networks; and sequentially enabling said plural parallel paths by supplying selected ones of said switchable transistors with an output signal from selected corresponding ones of said sequentially activated plural triggering networks.

16. The method of claim 15 wherein a predetermined delay is interposed between said sequential activation of a first one of said plural triggering networks and a second one of said plural triggering networks.

17. The method of claim 16 wherein said monolithic circuit includes an analog-to-digital and digital-to-analog signal conversion module and a digital audio signal synthesizer module.

18. A method for regulating peak currents during a HIGH to LOW transition on a capacitively loaded port in a monolithic integrated circuit having an analog-to-digital and digital-to-analog signal conversion module and a digital audio signal synthesizer module, said method comprising the steps of:

providing a load signal;

linking said load signal to the integrated circuit ground through first, second, third, and fourth parallel paths, each path characterized by a gated transistor;

providing first, second, third, and fourth triggering networks, each selected one of said triggering networks having an output signal and an input signal clockable to appear as said output signal of said selected triggering network, said triggering networks arranged in a sequential cascade characterized by said output signal of said first triggering network providing said input signal for said second triggering network and said output signal of said second triggering network providing said input signal for said third triggering network and said output signal of said third triggering network providing said input signal for said fourth triggering network;

generating a digitally selected threshold signal;

comparing said load signal and said threshold signal to derive a pull-down signal;

supplying said pull-down signal as said input signal of said first triggering network of said sequential cascade;

clocking said first, second, third, and fourth triggering networks with a common clocking signal; and sequentially enabling said first, second, third, and fourth parallel paths by supplying said gated transistors of said first, second, third, and fourth parallel paths with the corresponding said output signals from said first, second, third, and fourth triggering networks respectively, said output signals derived as said input signal of said first triggering network sequentially propagates through said cascade in substantial correspondence with sequential state changes of said common clocking signal.

19. The method of claim 18 wherein said load signal is generated by a game controller capacitor.

20. A system for regulating peak transition currents on a capacitively loaded port in a monolithic integrated circuit having an analog-to-digital and digital-to-analog signal conversion module and a digital audio signal synthesizer module, said system comprising:

an input port for receiving a capacitive load signal;

plural pull-down parallel paths linking said input port and the integrated circuit ground, each path characterized by a gated transistor;

a digital-to-analog convertor generating a selectable threshold signal;

a comparator generating a pull-down signal derived from the comparison of said load signal and said selectable threshold signal;

plural clock responsive triggering networks arranged in a sequential cascade, each selected one of said triggering networks having an output signal supplied to a selected corresponding one of said plural pull-down paths and an input signal clockable to appear as said output signal of said selected triggering network; and a clocking circuit having a clock-derived signal supplied in substantial coincidence to each of said plural triggering networks to sequentially propagate the state of said pull-down signal through said cascade to sequentially activate said plural pull-down paths.

21. The system of claim 20 wherein selected ones of said plural pull-down paths are characterized by said gated transistors being in series with a resistive element.

22. The system of claim 20 further comprising a system signal generator having a system signal and wherein each of said plural triggering networks has an output signal-determinative input signal responsive to said system signal and said plural pull-down paths are disabled in response to assertion of said system signal on said output signal-determinative input signals.

23. The system of claim 22 wherein an inverted clock signal derived from said clock-derived signal is supplied to a selected set of said plural triggering networks.

24. The system of claim 22 wherein said triggering networks are D flip-flops.

25. The system of claim 22 wherein said monolithic integrated circuit is fabricated by a CMOS technology.

26. The system of claim 22 further comprising a trim register having a data signal supplied to said digital-to-analog converter.

27. The system of claim 22 wherein said system signal is a WRITE signal.

28. The method of claim 2 wherein said capacitive load is discharged in approximately 2 microseconds.

* * * * *